(12) United States Patent
Yu et al.

(10) Patent No.: US 8,441,015 B2
(45) Date of Patent: May 14, 2013

(54) LIQUID CRYSTAL DISPLAY DEVICE AND FABRICATION METHOD THEREOF

(75) Inventors: Sang Hee Yu, Gyeonggi-Do (KR); Sang Chul Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 707 days.

(21) Appl. No.: 11/300,506

(22) Filed: Dec. 15, 2005

(65) Prior Publication Data

US 2007/0001172 A1    Jan. 4, 2007

(30) Foreign Application Priority Data

Jun. 29, 2005    (KR) .................. 10-2005-0057394

(51) Int. Cl.
*H01L 29/10*    (2006.01)
(52) U.S. Cl.
USPC ......... 257/66; 257/72; 257/E21.413; 438/151
(58) Field of Classification Search ............ 257/66, 257/72, E21.413; 438/151
See application file for complete search history.

(56) References Cited

U.S. PATENT DOCUMENTS

| | | | |
|---|---|---|---|
| 5,773,844 A * | 6/1998 | Kawamura et al. | 257/57 |
| 5,990,555 A | 11/1999 | Ohori et al. | |
| 6,746,905 B1 * | 6/2004 | Fukuda | 438/164 |
| 6,937,302 B2 * | 8/2005 | Kikkawa et al. | 349/113 |
| 7,368,755 B2 * | 5/2008 | Jeoung et al. | 257/84 |
| 2004/0048407 A1 * | 3/2004 | Lee | 438/30 |
| 2004/0125326 A1 * | 7/2004 | Nam | 349/187 |
| 2005/0099551 A1 | 5/2005 | Yang et al. | |
| 2005/0134752 A1 * | 6/2005 | Yang et al. | 349/42 |
| 2005/0174520 A1 | 8/2005 | Tomihari | |
| 2005/0263769 A1 * | 12/2005 | Chul Ahn | 257/72 |

FOREIGN PATENT DOCUMENTS

| | | |
|---|---|---|
| CN | 1619392 | 5/2005 |
| JP | 05-055257 | 3/1993 |
| JP | 07-169973 | 7/1995 |
| JP | 2001-267420 | 9/2001 |
| JP | 2002-176179 | 6/2002 |
| JP | 2003-78145 | 3/2003 |

* cited by examiner

*Primary Examiner* — Matthew Landau
*Assistant Examiner* — Colleen E Snow
(74) *Attorney, Agent, or Firm* — Morgan, Lewis & Bockius LLP

(57) ABSTRACT

A method for fabricating an LCD device includes providing first and second substrates; forming an active layer on the first substrate and forming first and second ohmic contact layers on the active layer; forming a first insulation film on the first substrate; forming a gate electrode on the first substrate; forming a second insulation film on the first substrate; forming a pixel electrode on the first substrate; forming a third insulation film on the first substrate; removing a portion of the first to third insulation film to form first and second contact holes, wherein the first contact hole exposes a portion of the first ohmic contact layer and the second contact hole exposes a portion of the second ohmic contact layer; forming a source electrode electrically connected with the first ohmic contact layer within the first contact hole; forming a drain electrode electrically connected with the second ohmic contact layer and the pixel electrode within the second contact hole; and attaching the first and second substrates.

3 Claims, 11 Drawing Sheets

LIQUID CRYSTAL DISPLAY DEVICE AND FABRICATION METHOD THEREOF

This application claims the benefit of Korean Application No. 57394/2005 filed on Jun. 29, 2005, which is hereby incorporated by reference.

BACKGROUND OF THE INVENTION

1. Field of the Invention

The present invention relates to a liquid crystal display (LCD) device and its fabrication method, and more particularly, to an LCD device employing a thin film transistor (TFT) having a top gate structure and simplified fabrication method that reduces the number of masks used to fabricate the TFT.

2. Background of the Related Art

The demand for portable information display devices has been increasing rapidly, resulting in the active research and development for the thin flat panel displays (FPD). These thin FPDs are replacing the CRT (Cathode Ray Tube) today. Among the FPDs, the LCD device has been used widely in the notebook computer, desktop monitors, or the like because the LCD device offers an excellent color, high resolution, and better picture quality. Typically, the LCD device displays images by controlling the optical anisotropy of liquid crystal molecules.

The liquid crystal display panel includes a first substrate (a color filter substrate) and a second substrate (an array substrate), and a liquid crystal layer is formed between the color filter substrate and the array substrate. In the LCD device, a thin film transistor (TFT) is commonly used as a switching device. An amorphous silicon thin film or a polycrystalline silicon thin film may be used as a channel layer of the TFT. In fabricating the LCD device, a plurality of masking processes or photolithography processes are required to fabricate the LCD device including the TFT. Accordingly, when the number of masking processes is reduced, it helps increase the production yield.

The structure of a related art LCD device will now be described with reference to FIG. 1. FIG. 1 is a plan view showing a portion of an array substrate of the related art LCD device. Although actual LCD devices include M×N pixels as the N gate lines cross the M data lines, only one pixel is shown in FIG. 1 for convenience.

As shown, a gate line 16 is arranged in horizontal direction and a data line 17 is arranged in vertical direction on an array substrate 10. A pixel region is defined by the intersections of the gate line 16 and the data line 17. A TFT (a switching device) is formed at an intersection of the gate line 16 and the data line 17. A pixel electrode 18 is formed in each pixel region. The TFT includes a gate electrode 21 connected to the gate line 16, a source electrode 22 connected to the data line 17, and a drain electrode 23 connected to the pixel electrode 18. The TFT also includes a first insulation film (not shown) and a second insulation film (not shown) for insulating the gate electrode 21 from the source/drain electrodes 22 and 23, and an active area 24 that forms a conductive channel between the source and drain electrodes 22 and 23 when a gate voltage is supplied to the gate electrode 21.

The first contact holes 40A are formed through the first and second insulation films, and the source electrode 22 is electrically connected with a source region of the active area 24 within one of the first contact hole 40A. Similarly, the drain electrode 23 is electrically connected with a drain region of the active area 24 within the other first contact hole 40A. A third insulation film (not shown) having a second contact hole 40B is formed on the drain electrode 23, so that the drain electrode 23 and the pixel electrode 18 are electrically connected within the second contact hole 40B.

The process of fabricating the array substrate as described above will now be explained with reference to FIGS. 2A to 2H. FIGS. 2A to 2H are sectional views taken along line I-I' of FIG. 1 illustrating the fabrication process of the array substrate of FIG. 1. The TFT is formed as an amorphous silicon TFT which uses the amorphous silicon as a channel layer. In addition, the amorphous silicon TFT includes a TFT having a top gate structure in which a gate electrode is formed over the portion of the channel layer.

As shown in FIG. 2A, an amorphous silicon thin film 20 and n+ amorphous silicon thin film 30 are sequentially formed on a substrate 10. Thereafter, as shown in FIG. 2B, the amorphous silicon thin film 20 and the n+ amorphous silicon thin film 30 are selectively patterned to form an active layer 20' and n+ amorphous silicon thin film pattern 30'. The n+ amorphous silicon thin film pattern 30' remains on the active layer 20'.

Next, as shown in FIG. 2C, the n+ amorphous silicon pattern 30' is selectively patterned by a photolithography process (a second masking process) to form a first ohmic contact layer 30A and a second ohmic contact layer 30B.

Then, as shown in FIG. 2D, a first insulation film 15A and a conductive metallic material are sequentially deposited on the entire surface of the substrate 10 where the active layer 20' has been formed. Thereafter, the conductive metallic material is selectively patterned by the photolithography process (a third masking process) to form a gate electrode 21 over the portion of the active layer 20'.

Next, as shown in FIG. 2E, a second insulation film 15B is deposited on the entire surface of the substrate 10 including the gate electrode 21. Then, a portion of the first and second insulation films 15A and 15B are removed through the photolithography process (a fourth masking process) to form a pair of first contact holes 40A exposing a portion of the ohmic contact layers 30A and 30B.

And, as shown in FIG. 2F, a conductive metallic material is deposited on the entire surface of the substrate 10 and patterned by the photolithography process (a fifth masking process) to form source electrode 22 and a drain electrode 23. The source electrode 22 electrically connects with the first ohmic contact layer 30A within the first contact hole 40A. Similarly, the drain electrode 23 electrically connects with the second ohmic contact layer 30B within the first contact holes 40A. And, a portion of the conductive metallic layer constituting the source electrode 22 extends in one direction to form a data line 17.

Subsequently, as shown in FIG. 2G, a third insulation film 15C is deposited on the entire surface of the substrate 10 and then patterned by the photolithography process (a sixth masking process) to form a second contact hole 40B exposing a portion of the drain electrode 23.

Finally, as shown in FIG. 2H, a transparent conductive metallic material is deposited on the entire surface of the substrate 10 including the third insulation film 15C, and patterned by the photolithography process (a seventh masking process) to form a pixel electrode 18. The pixel electrode 18 electrically connects with the drain electrode 23 within the second contact hole 40B.

As mentioned above, there are total of seven (7) photolithography processes required to fabricate the related art array substrate including the TFT having the top gate structure. The seven (7) photolithography processes are needed to pattern the active layer, the ohmic contact layer, the gate electrode, the first contact hole, the source/drain electrodes, the second contact hole and the pixel electrode.

The photolithography process transfers a pattern formed on a mask onto a thin film deposited on a substrate, thereby forming a desired pattern. Some of the typical photolithography process includes an application of photosensitive solution, exposing, and developing processes. As a result, these photolithography processes reduce the production yield and increase the possibility that a fabricated TFT is defective.

In addition, the masks designed to form the pattern are expensive such that when more masks are used in the fabricating process, the fabrication cost increases.

SUMMARY OF THE INVENTION

Accordingly, the present invention is directed to an LCD device and fabrication method thereof that substantially obviates one or more of the problems due to limitations and disadvantages of the related art.

An object of the present invention is to provide an LCD device and fabrication method thereof that is capable of reducing the total number of masks used while fabricating the array substrate, including the thin film transistor (TFT) having the top gate structure. Specifically, by connecting a drain electrode and an ohmic contact layer, and the drain electrode and a pixel electrode within one contact hole simultaneously to reduce the total number of masks.

Another object of the present invention is to provide a liquid crystal display (LCD) device in which a TFT of a top gate structure is applied to a flexible substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating an liquid crystal display (LCD) device includes providing first and second substrates; forming an active layer on the first substrate and forming first and second ohmic contact layers on the active layer; forming a first insulation film on the first substrate; forming a gate electrode on the first substrate; forming a second insulation film on the first substrate; forming a pixel electrode on the first substrate; forming a third insulation film on the first substrate; removing a portion of the first to third insulation film to form first and second contact holes, wherein the first contact hole exposes a portion of the first ohmic contact layer and the second contact hole exposes a portion of the second ohmic contact layer; forming a source electrode electrically connected with the first ohmic contact layer within the first contact hole; forming a drain electrode electrically connected with the second ohmic contact layer and the pixel electrode within the second contact hole; and attaching the first and second substrates.

In another aspect, a liquid crystal display (LCD) device includes an active layer on a first substrate; first and second ohmic contact layers on the active layer; a first insulation film on the first substrate; a gate electrode on the first substrate; a second insulation film on the first substrate; a pixel electrode on the pixel region; a third insulation film on the first substrate; first and second contact holes formed through the first to third insulation films, wherein certain portions of the first and second ohmic contact layers are exposed; a source electrode electrically connected with the first ohmic contact layer within the first contact hole, wherein a portion of the source electrode is extended to form a data line; a drain electrode electrically connected with the second ohmic contact layer and the pixel electrode within the second contact hole, and a second substrate attached to the first substrate.

In another aspect, an array substrate of an liquid crystal display (LCD) device includes data lines and gate lines on a substrate; a pixel region defined by intersections of the data lines and the gate lines; a pixel electrode in the pixel region; and a thin film transistor formed at an intersection of the data line and the gate line, wherein a source electrode is electrically connected with a first ohmic contact layer within a first contact hole and a drain electrode is electrically connected with a second ohmic contact layer and the pixel electrode within a second contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
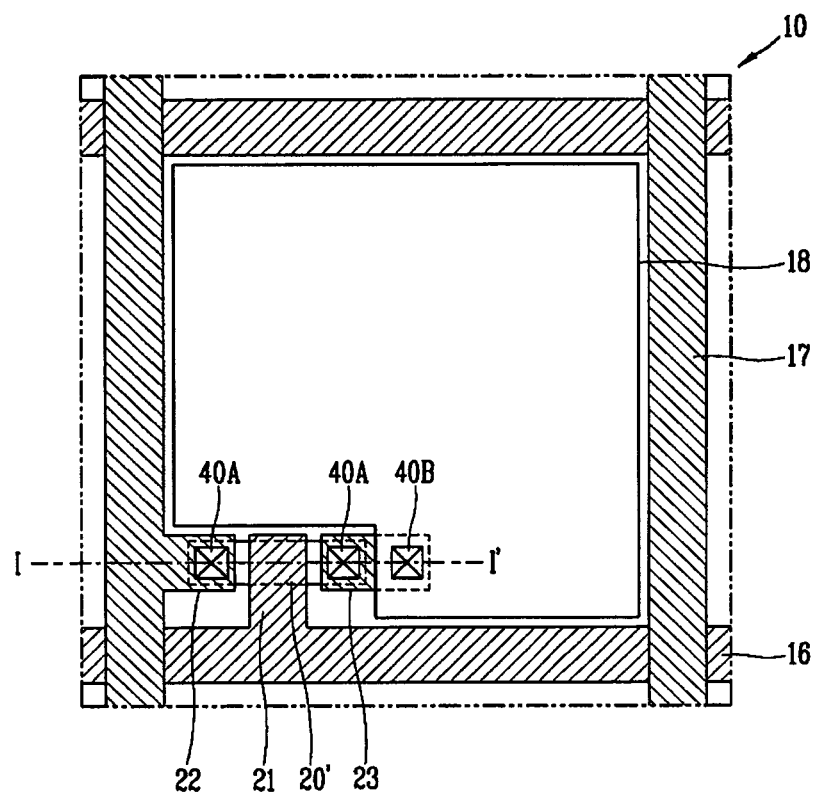
FIG. 1 is a plan view showing a related art array substrate of an LCD device.
Figure 2A:
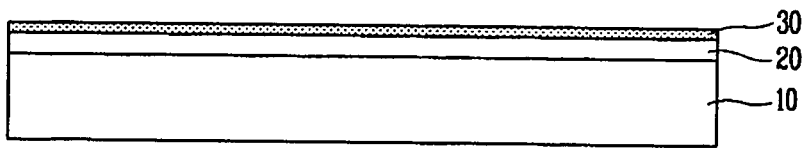
FIGS. 2A to 2H are sectional views showing a related fabrication process for the related art array substrate of FIG. 1.
Figure 2B:
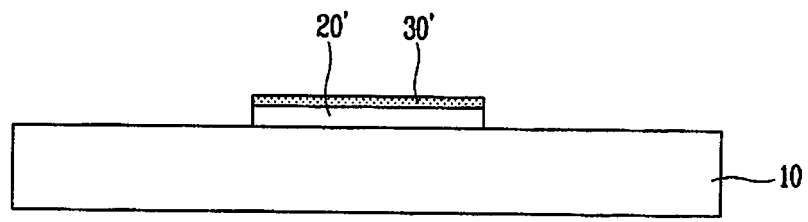
Figure 2C:
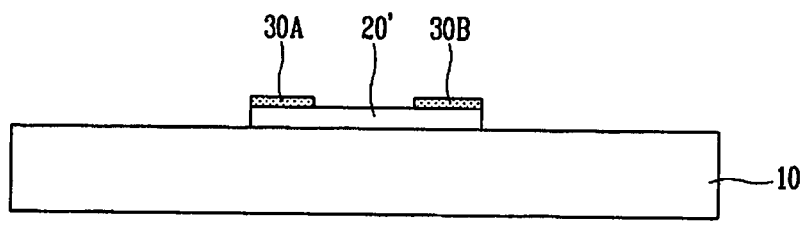
Figure 2D:
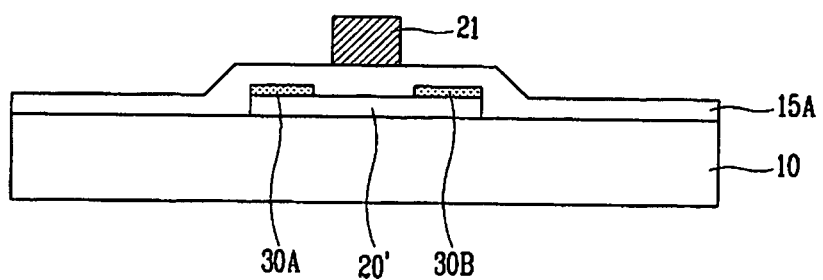
Figure 2E:
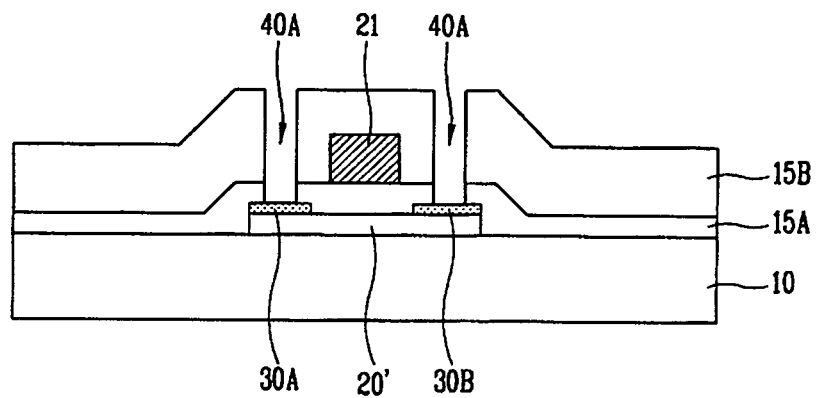
Figure 2F:
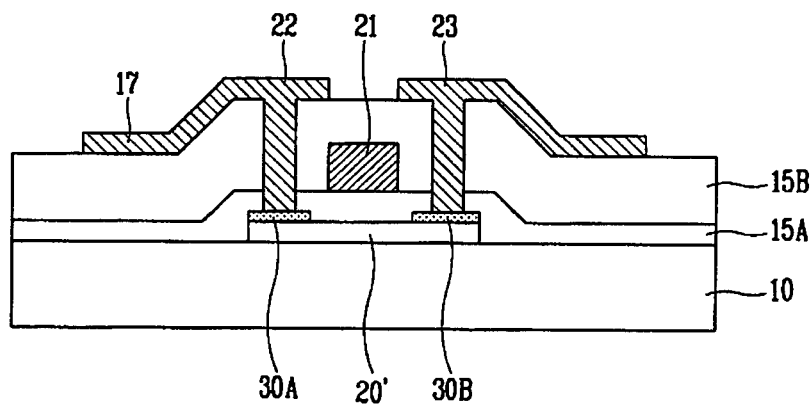
Figure 2G:
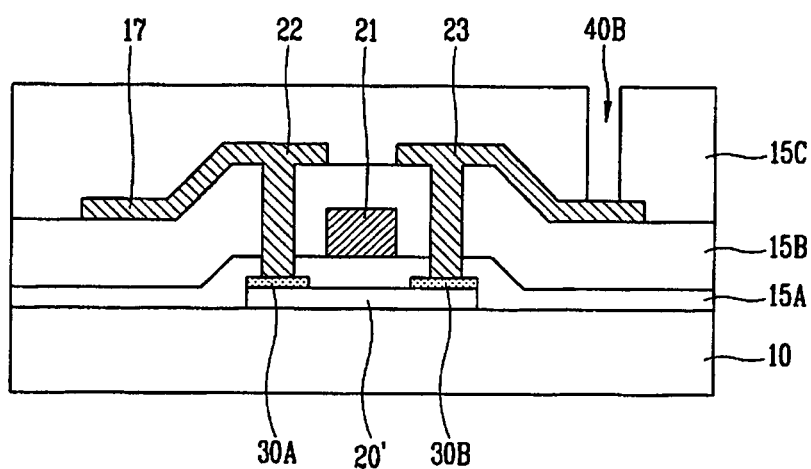
Figure 2H:
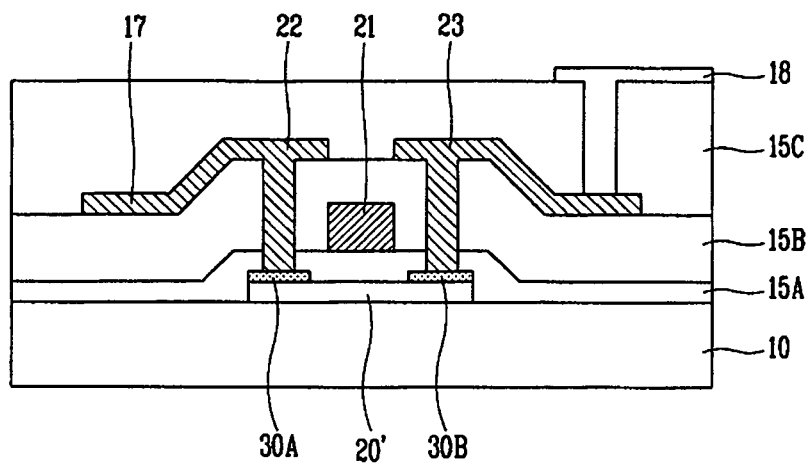
Figure 3:
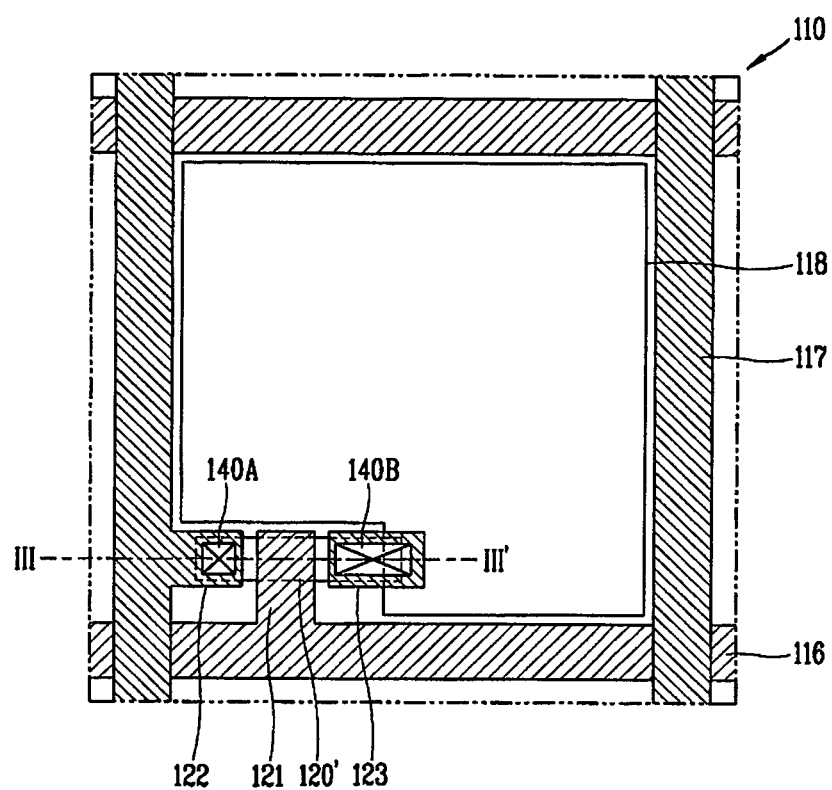
FIG. 3 is a plan view showing an exemplary array substrate of an LCD device in accordance with an exemplary embodiment of the present invention.

Reference will now be made in detail to an embodiment of the present invention, an example of which is illustrated in the accompanying drawings. FIG. 3 is a plan view showing an exemplary array substrate of an LCD device in accordance with a first exemplary embodiment of the present invention. An actual LCD device includes M×N pixels defined by the intersections of the N gate lines and the M data lines. However, for convenience, only one pixel including a thin film transistor (TFT) having a top gate structure is explained in FIG. 3.

In the first exemplary embodiment, a channel layer in the TFT is formed by an amorphous silicon thin film. However, the present invention is not limited to the amorphous silicon thin film only, but other suitable material such as a polycrystalline silicon thin film may be used for the channel layer. The TFT having the top gate structure in the first exemplary embodiment includes a gate electrode formed over a portion of the channel layer.

As shown in FIG. 3, an array substrate 110 includes a gate line 116 arranged in a horizontal direction and a data line 117 arranged in a vertical direction, and pixel region is defined by the intersections of the gate line 116 and the data line 117. The TFT, which acts as a switching device, is formed at the intersection of the gate line 116 and the date line 117. A pixel electrode 118 is formed in the pixel region and electrically connected with the TFT. The pixel electrode 118 and a common electrode of a color filter substrate (not shown) drive liquid crystal molecules (not shown) together.

The TFT includes a gate electrode 121 connected with the gate line 116, a source electrode 122 connected with the data line 117 and a drain electrode 123 connected with the pixel electrode 118. In addition, the TFT also includes first to third insulation films (not shown) for insulating the gate electrode 121 from the source/drain electrodes 122 and 123. The first to third insulation films (not shown) also insulate the gate electrode 121 from an active layer 120'. The active layer 120' is a conductive channel formed between the source electrode 122 and the drain electrode 123 when a gate voltage is supplied to the gate electrode 121.

The source electrode 122 is electrically connected with a first ohmic contact layer (not shown) of the active layer 120' within a first contact hole 140A. And, the drain electrode 123 is electrically connected with a second ohmic contact layer (not shown) of the active layer 120' within a second contact hole 140B. Both the first and second contact holes 140A and 140B are formed through the first to third insulation films. At this time, a portion of the source electrodes 122 extends in one direction to form a portion of the data line 117. A portion of the drain electrode 123 is electrically connected with the pixel electrode 118 within the second contact hole 140B by directly contacting the pixel electrode 118. In this case, the first and second contact holes 140A and 140B are simultaneously formed through the same masking process.

In the first exemplary embodiment of the present invention, the number of masks used to fabricate the TFT is reduced by making the drain electrode 123 electrically connected with the second ohmic contact layer within the second contact hole 140B and making the drain electrode 123 electrically connected with the pixel electrode 118 within the second contact hole 140B simultaneously.

Figure 4A:
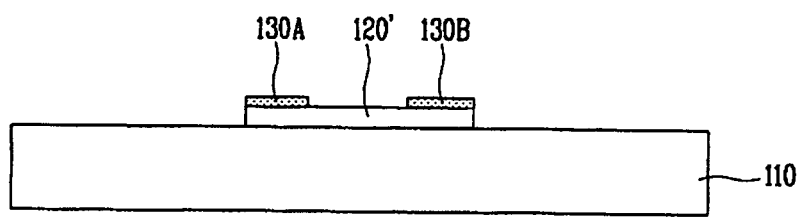
FIGS. 4A to 4E are sectional views taken along line III-III' of FIG. 3 showing an exemplary fabrication process for the exemplary array substrate of FIG. 3.

FIGS. 4A to 4E are sectional views taken along line III-III' of FIG. 3 showing an exemplary fabrication process for the exemplary array substrate of FIG. 3. FIGS. 5A to 5E are plan views showing the exemplary fabrication process for the array substrate of FIG. 3. As shown in FIGS. 4A and 5A, an active layer 120' formed of a silicon thin film and ohmic contact layers 130A and 130B formed of an n+ amorphous silicon thin film are formed on the substrate 110. The active layer 120' and first and second ohmic contact layers 130A and 130B are formed by a photolithography process (a first masking process). The substrate 110 is made of a transparent material such as glass. The ohmic contact layers 130A and 130B over the active layer 120' at the left and right sides of the active layer 120'. The ohmic contact layers 130A and 130B form an ohmic contact between the source/drain electrodes (to be described) and the active layer 120'.

A buffer layer formed of a silicon oxide film ($SiO_2$) may be deposited on the substrate 110, then, the active layer 120' can be formed on the buffer layer. The buffer layer prevents an infiltration of an impurity such as natrium (Na) existing in the glass substrate 110 into an upper layer during the fabrication process. In addition, the active layer 120' and the ohmic contact layers 130A and 130B can be formed through a single masking process by a slit (diffraction) exposure, which will be described in detail with reference to FIGS. 6A to 6F.

Figure 6A:
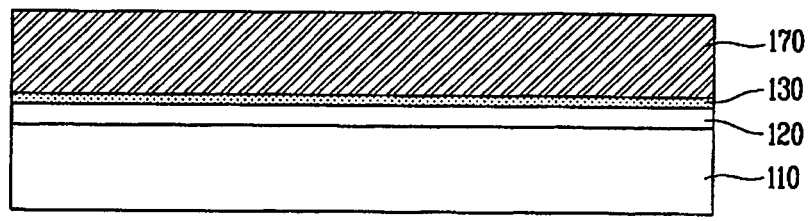
FIGS. 6A to 6D are sectional views showing a detailed first masking process using a diffraction (slit) exposure to form an active layer and first and second ohmic contact layers of FIG. 4A.

FIGS. 6A to 6D are sectional views showing a detailed first masking process using a diffraction (slit) exposure to form the active layer 120' and first and second ohmic contact layers 130A and 130B of FIG. 4A. As shown in FIG. 6A, an amorphous silicon thin film 120 and an n+ amorphous silicon thin film 130 are sequentially deposited on the entire surface of the substrate 110. Next, a photosensitive film 170 made of a photosensitive material such as photoresist is deposited on the entire surface of the substrate 110.

Figure 6B:
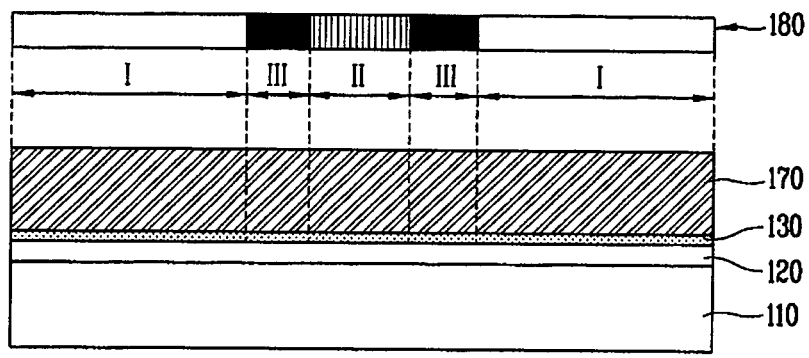

As shown in FIG. 6B, light is irradiated on the photosensitive film 170 through a slit mask 180 having a slit region. The slit mask 180 includes a first transmission region (I) for transmitting the entire light, a second transmission region (II) for transmitting some light, and a blocking region (III) for blocking the entire irradiated light. Light transmitted through the mask 180 can be irradiated on the photosensitive film 170.

The second transmission region (II) of the slit mask 180 has a slit structure. The amount of light irradiated through the second transmission region (II) is smaller than the amount of light irradiated through the first transmission regions (I). Thus, when the photosensitive film 170 is exposed and developed, the thickness of the photosensitive film 170 at the portion corresponding to the slit region (II) of the slit mask 180 is different from the thickness of the photosensitive film 170 at the portion corresponding to the first transmission regions (I) and the blocking regions (III) of the slit mask 180.

In case a positive type photoresist is used as the photosensitive film 170, the thickness of photosensitive film remaining on the slit region (II) is thinner than the thickness of the photosensitive film remaining on the block regions (III). And, in case a negative type photoresist is used as the photosensitive film 170, the thickness of the photosensitive film remaining on the slit region (II) is thinner than that of the photosensitive film remaining on the first transmission regions (I). In the first exemplary embodiment, the positive type photoresist is used. However, the present invention is not limited thereto and the negative type photoresist can be also used.

Figure 6C:
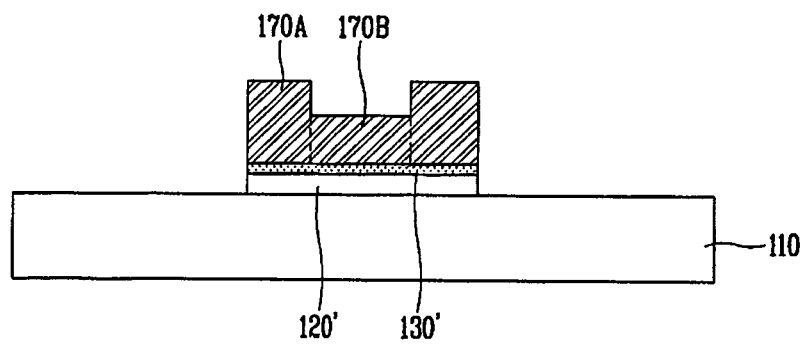
Figure 6D:
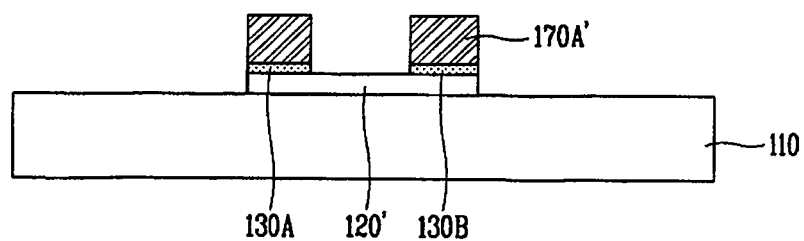

Subsequently, as shown in FIG. 6C, photosensitive film patterns 170A and 170B each having a different thickness are formed at the portions corresponding to the blocking regions (III) and the second transmission region (II), respectively. Whereas, the photosensitive film at the portion corresponding to the first transmission region (I) is removed entirely to expose the surface of the n+ amorphous silicon thin film 130.

Thereafter, a portion of the lower n+ amorphous silicon thin film pattern 130' is selectively removed by the remaining photosensitive film pattern 170A, 170B, and 170A' as a mask. A first ohmic contact layer 130A and a second ohmic contact layer 130B are formed on the active layer 120' making the source/drain electrodes. In addition, a certain portion of the active layer 120' is made to become ohmic-contact between the source/drain electrodes and the active layer 120'. In this manner, the active layer 120' and the ohmic contact layers 130A and 130B can be formed through a single masking process by the slit exposure. Thus, one mask process can be omitted and the number of masks used is reduced. However, the present invention is not limited to the single mask process to form the active layer 120' and first and second ohmic contact layers 130A and 130B. If desired, the active layer 120' and first and second ohmic contact layers 130A and 130B can be formed through a separate masking processes, namely, through a two-mask process.

Figure 4B:
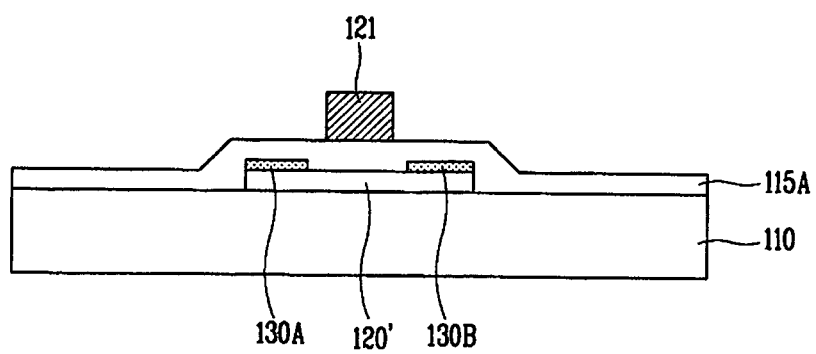
Figure 5A:
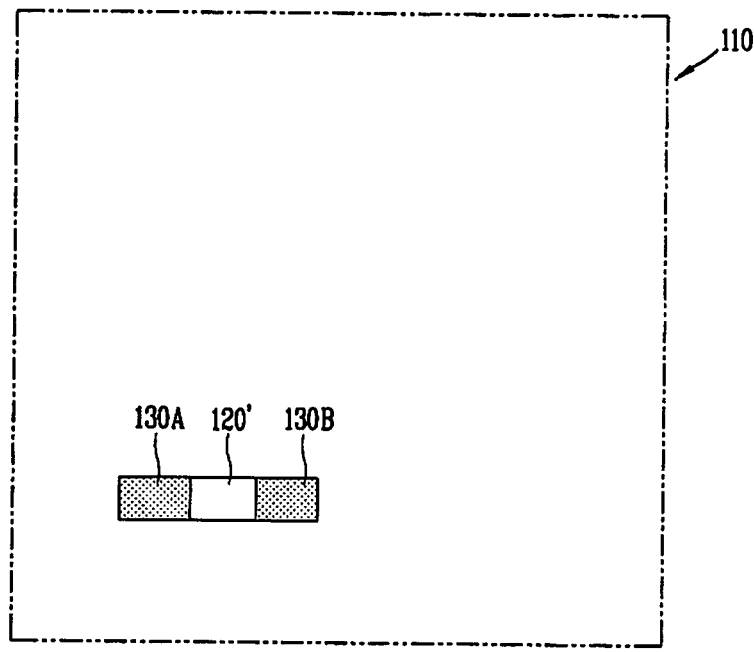
FIGS. 5A to 5E are plan views showing the exemplary fabrication process for the exemplary array substrate of FIG. 3.
Figure 5B:
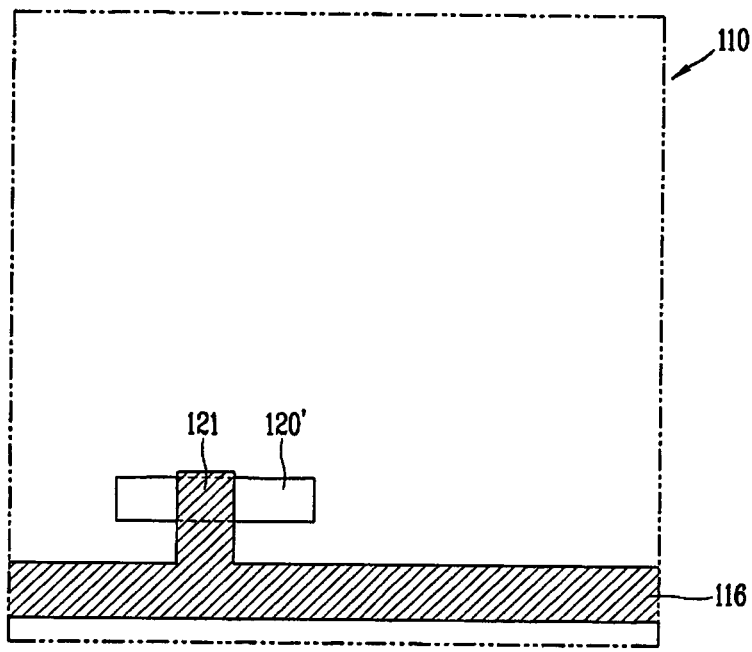

As shown in FIGS. 4B and 5B, the first insulation film 115A and the first conductive metal material are sequentially deposited on the entire surface of the substrate 110 including the active layer 120'. The first conductive metal material is selectively patterned by the photolithography process (a second masking process) to form the gate electrode 121 over a portion of the active layer 120'. At the same time, the gate line 116 electrically connects with the gate electrode 121. The first conductive material includes a low-resistance opaque conductive material such as aluminum (Al), an aluminum alloy, tungsten (W), copper (Cu), chromium (Cr), molybdenum (Mo) or other suitable material.

Figure 4C:
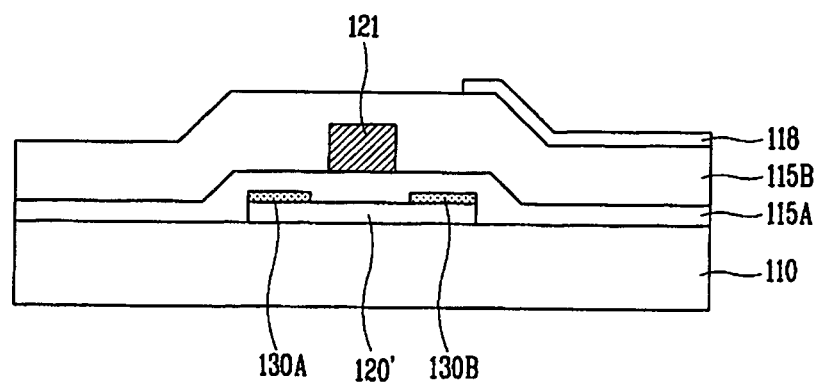
Figure 5C:
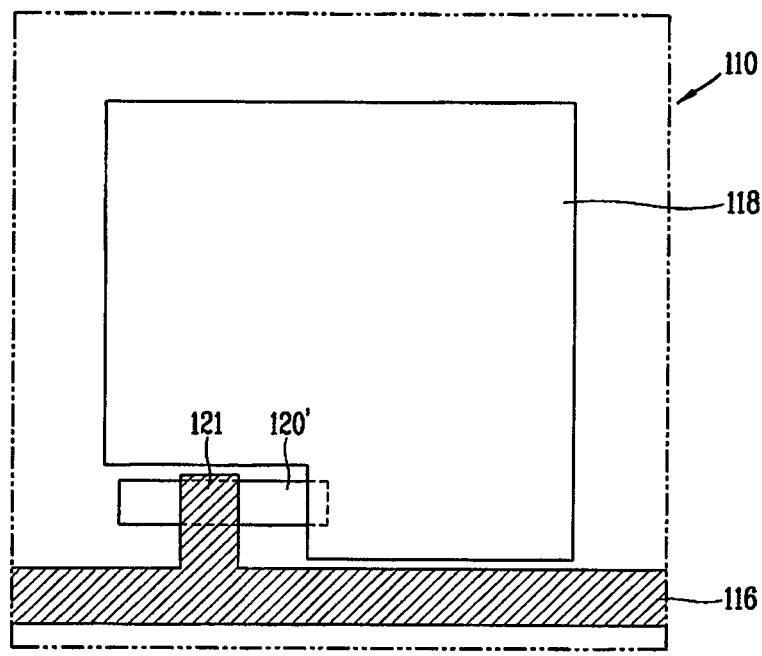

In FIGS. 5B to 5E, illustration of the ohmic contact layers 130A and 130B formed on the active layer 120' are omitted for the convenience. Next, as shown in FIGS. 4C and 5C, a second insulation film 115B is deposited on the entire surface of the substrate 110 including the gate electrode 121 and the gate line 116. A second conductive metal material is deposited on the entire surface of the substrate 110, then it is selectively patterned by the photolithography process (a third masking process) to form the pixel electrode 118 in the pixel region. The second conductive metal material includes a transparent conductive material having excellent light transmittance such as indium tin oxide (ITO) or indium zinc oxide (IZO).

Figure 4D:
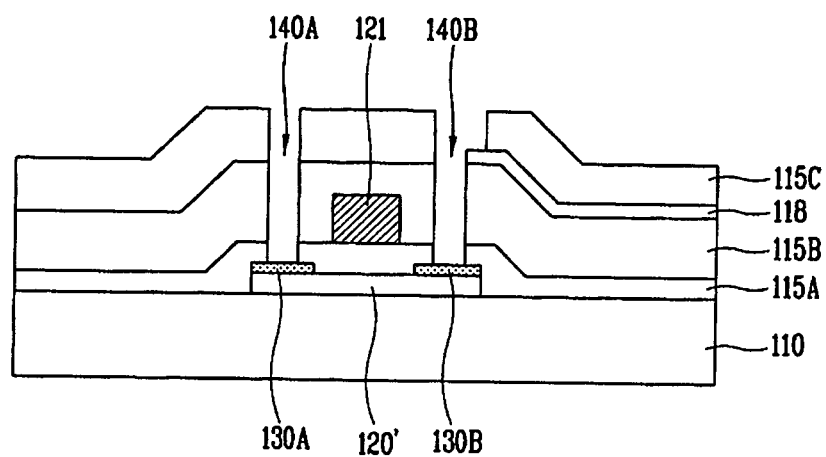
Figure 5D:
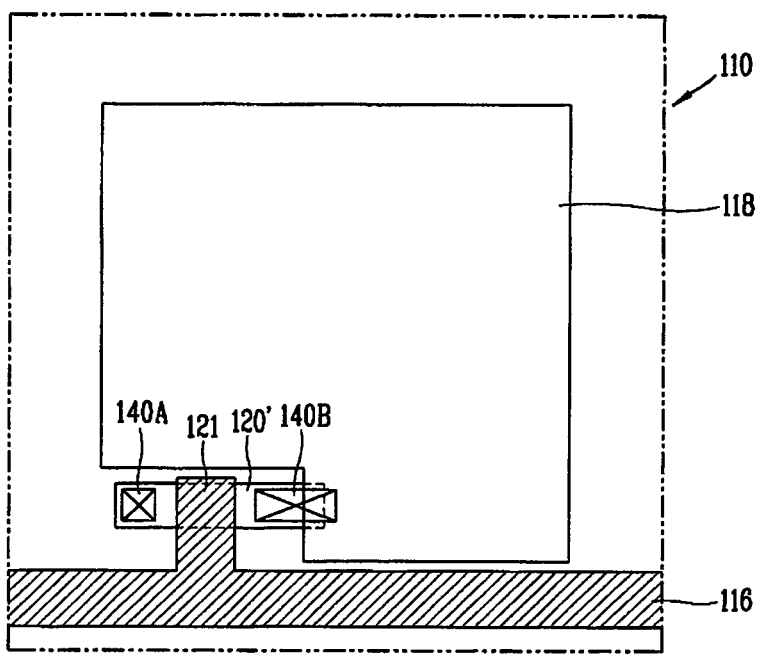

Next, as shown in FIGS. 4D and 5D, the second insulation film is deposited on the entire surface of the substrate including the pixel electrode 118. A portion of the first to third insulation films 115A to 115C is removed through the photolithography process (a fourth masking process) to form the first and second contact holes 140A and 140B, which exposes a portion of the ohmic contact layers 130A and 130B.

A portion of the second ohmic contact layer 130B exposed through a second contact hole 140B is determined by the pixel electrode 118. Specifically, the pixel electrode 118 is used as a mask while etching the insulation films. Therefore, when the contact holes 140A and 140B are formed, the second contact hole 140B is formed such that a portion of the pixel electrode 118 is partially exposed and directly contacting the drain electrode.

Figure 4E:
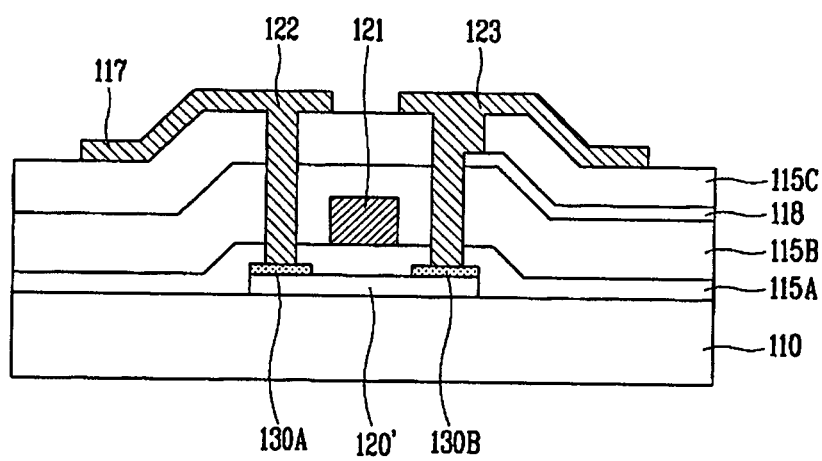
Figure 5E:
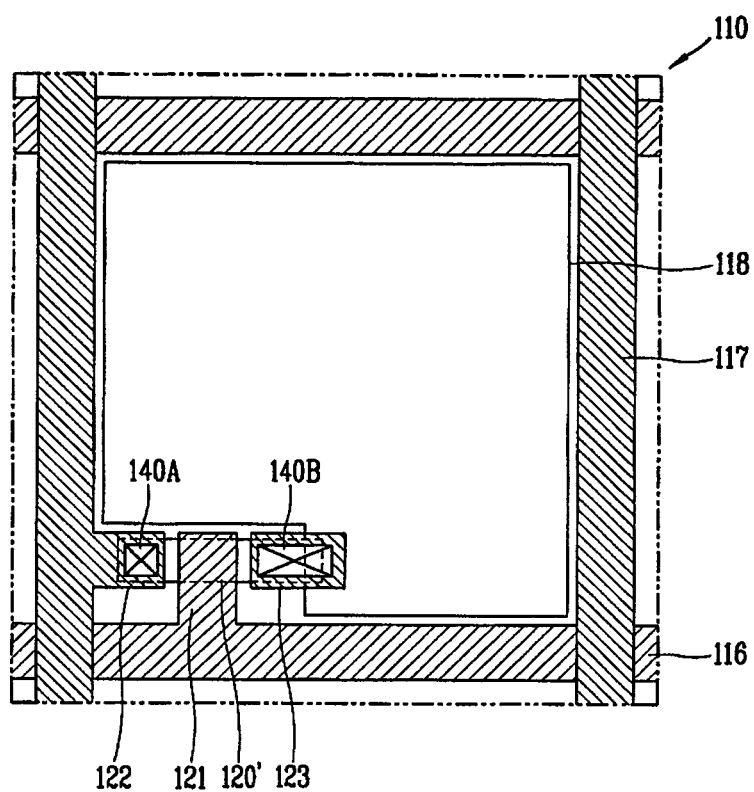

Thereafter, as shown in FIGS. 4E and 5E, the third conductive metal material is deposited on the entire surface of the substrate 110 and then patterned by the photolithography process (a fifth masking process) to form the source electrode 122 connected with the first ohmic contact layer 130A within the first contact hole 140A and the drain electrode 123 connected with the second ohmic contact layer 130B within the second contact hole 140B. At this time, a portion of the conductive metal layer constituting the source electrode 122 extends in one direction to form the data line 117.

As explained above and as shown in FIG. 4E, the drain electrode 123, the drain electrode 123 and the second ohmic contact layer 130B and the drain electrode 123 and the pixel electrode 118 are all electrically connected within the second contact hole 140B. Thus, it is not necessary to use additional mask processes to form the contact hole which exposes the portion of the drain electrode 123. Furthermore, since the drain electrode 123 is directly connected with the portion of the pixel electrode 118 within the second contact hole 140B, one mask process can be omitted.

As described, there are total of five (5) photolithography processes to fabricate the exemplary array substrate including the TFT having the top gate structure in the first exemplary embodiment of the present invention. The five photolithography processes are used to pattern the active layer 120', the ohmic contact layers 130A and 130B, the gate electrode 121, the pixel electrode 118, the first and second contact holes 140A and 140B and the source/drain electrodes 122 and 123, respectively. The active layer 120' and the ohmic contact layers 130A and 130B are formed through the single masking process, thus the contact hole formation process is omitted. Accordingly, two masking processes can be omitted as compared to the related art fabrication process. As a result, the simplified fabrication process can increase the production yield and can reduce the fabrication cost.

The TFT having the top gate structure can be easily applied to a flexible display device devices in which a plastic substrate, not the glass substrate, is used. In case of the flexible display device devices using the plastic substrate, process temperature is critical. The plastic substrate can deform while the fabrication process is being performed. Specifically, the worst substrate deformation occurs when the active layer is formed.

Thus, by applying the top gate structure, where the active layer causing the worst deformation of the substrate is formed at the lowermost layer on the substrate, the amount of deformation may be minimized in the substrate in the subsequent fabrication process. Accordingly, the fabrication processes can be performed without misalignment.

The flexible display device devices are anticipated to become an up-coming technology in the display field. An exemplary flexible display device of a second exemplary embodiment of the present invention will be described in detail. The flexible display device is called a roll display and implemented on a flexible thin substrate such as plastic. The flexible characteristic prevents damage to the display device even when the flexible display device is bent or folded like a paper. Currently, an organic EL and an LCD device having the thickness of 1 mm or thinner are the potential candidates for the flexible display device. Since the organic EL emits light by itself, it stands out well in darkness and in the bright places. Furthermore, the organic EL has the fastest response speed, thus making it possible to play video on the display device. In addition, the organic EL can be designed as a ultra-thin product, so it can make various mobile devices such as a slim mobile phone.

As described above, when the TFT having the top gate structure in which the active layer is formed in the flexible display device at the lowermost layer on the plastic substrate, the deformation of the substrate can be minimized. In addition, exemplary array substrates of the flexible display device including the top gate structure TFT can be fabricated through five masking processes.

It will be apparent to those skilled in the art that various modifications and variations can be made in the LCD device and fabrication method thereof of the present invention without departing from the spirit or scope of the invention. Thus, it is intended that the present invention cover the modifications and variations of this invention provided they come within the scope of the appended claims and their equivalents.

What is claimed is:

1. A method for fabricating an liquid crystal display (LCD) device, the method comprising:
providing first and second substrates;
depositing an amorphous silicon thin film and an n+ amorphous silicon thin film on the first substrate;
forming an active layer on the first substrate by selectively etching the amorphous silicon thin film through a masking process;
forming first and second ohmic contact layers on left and right sides of the active layer by selectively etching the n+ amorphous silicon thin film through the masking process;
forming a first insulation film on the first substrate including the active layer and the first and second ohmic contact layers;

forming a gate electrode to form a gap away from the first and second ohmic contact layers not to overlap with the first and second ohmic contact layers on the first insulation film;

forming a second insulation film on the first substrate including the gate electrode;

forming a pixel electrode on the second insulation film to overlap with a portion of the second ohmic contact layer;

forming a third insulation film on the first substrate including the pixel electrode;

forming a first contact hole exposing a portion of the first ohmic contact layer by removing a portion of the first to third insulation films;

forming a second contact hole simultaneously exposing a portion of the second ohmic contact layer and the overlapped portion of the pixel electrode by removing a portion of the first to third insulation films;

forming a source electrode electrically connected with the first ohmic contact layer through the first contact hole on the third insulation film;

forming a drain electrode electrically connected with the second ohmic contact layer and the pixel electrode through the same second contact hole on the third insulation film; and attaching the first and second substrates.

2. A liquid crystal display (LCD) device, comprising:

an active layer formed of an amorphous silicon thin film on a first substrate;

first and second ohmic contact layers formed of an n+ amorphous silicon thin film on left and right sides of the active layer;

a first insulation film on the first substrate including the active layer and the first and second ohmic contact layers;

a gate electrode forming a gap away from the first and second ohmic contact layers not to overlap with the first and second ohmic contact layers on the first insulation film;

a second insulation film on the first substrate including the gate electrode;

a pixel electrode overlapping with a portion of the second ohmic contact layer on the pixel region of the second insulation film;

a third insulation film on the first substrate including the pixel electrode;

a first contact hole exposing a portion of the first ohmic contact layer through the first to third insulation films;

a second contact hole simultaneously exposing a portion of the second ohmic contact layer and the overlapped portion of the pixel electrode through the first to third insulation films;

a source electrode electrically connected with the first ohmic contact layer through the first contact hole on the third insulation film, wherein a portion of the source electrode is extended to form a data line;

a drain electrode electrically connected with the second ohmic contact layer and the pixel electrode through the same second contact hole on the third insulation film; and a second substrate attached to the first substrate.

3. The device of claim 2, wherein the first substrate includes a plastic material.

* * * * *